United States Patent [19]

McClure

[11] Patent Number: 5,764,592

[45] Date of Patent: Jun. 9, 1998

[54] EXTERNAL WRITE PULSE CONTROL METHOD AND STRUCTURE

[75] Inventor: David Charles McClure, Carrollton, Tex.

[73] Assignee: SGS-Thomson Microelectronics, Inc., Carrollton, Tex.

[21] Appl. No.: 771,642

[22] Filed: Dec. 21, 1996

[51] Int. Cl.$^6$ .................................................. G11C 7/00
[52] U.S. Cl. ........................ 365/233.5; 365/195; 365/201
[58] Field of Search .................................. 365/191, 195, 365/233, 233.5, 201, 200

[56] References Cited

U.S. PATENT DOCUMENTS 4,947,374  8/1990  Wada et al. .............................. 365/195
4,962,487  10/1990  Suzuki .................................... 365/233.5

*Primary Examiner*—Joseph A. Popek
*Attorney, Agent, or Firm*—Theodore E. Galanthay; Lisa K. Jorgenson; Renee M. Larson

[57] ABSTRACT

A method and control circuit structure for externally controlling the width of a write pulse of a synchronous integrated circuit memory device is disclosed. The method and control circuit provide for a test mode in which the width of the write pulse of the synchronous integrated circuit memory device may be externally controlled to be entered. After entering the test mode, the start of a write pulse of the synchronous integrated circuit memory device is triggered by a transition of a clock signal from a first logic state to a second logic state. The termination of the write pulse is accomplished by selective manipulation of an external control signal external to the synchronous integrated circuit memory device.

31 Claims, 3 Drawing Sheets

EXTERNAL WRITE PULSE CONTROL METHOD AND STRUCTURE

BACKGROUND OF THE INVENTION

1. Technical Field

The present invention relates generally to Integrated Circuit (IC) memory devices and more specifically to synchronous IC memory devices.

2. Discussion of the Prior Art

In a synchronous IC memory device, writing of the memory cell contained within the memory device is controlled internal to the memory device. Within the memory device, a write pulse width which performs writing of the memory cell is generated. Since the write pulse width is internally generated, its width may not be externally adjusted but is uniform for all memory devices of a given type.

Referring to FIG. 1, the conventional manner of internally controlling the writing of the memory cell is shown. A synchronous IC memory cell device is synched to an external clock signal K. When clock signal K transitions from a low to a high logic level, after some period of time a an internally generated Internal Write Control signal also transitions from a low to a high logic level to signify the start of the write pulse. The low to high transition of the Internal Write Control signal in turn causes a Bitline of the memory cell of the memory device to transition from a high to a low logic level. The Internal Write Control signal maintains a high logic level for the duration of the write pulse width, predetermined by the memory device type. After completion of the write pulse width, the Internal Write Control signal transitions from the high to the low logic level which in turn causes the Bitline to transition back to a high logic level, thereby ending the writing of the memory cell. The write pulse width of the memory device is determined by the Internal Write Control signal pulse and since it is internally generated according to the device type may not be externally manipulated to be lengthened or shortened as needed.

The inability to control the width of the write pulse of a synchronous IC memory device does not allow for certain characteristics of the memory device to be studied. For instance, the standard write pulse width of the memory device does not allow the narrowest write pulse width at which a write may be successfully performed to be determined. Such information on the narrowest permissible write pulse width could provide valuable insight into how much margin the memory device has in performing a write cycle, could be used to perform a stress test to identify marginal cells at an aggressively narrow write pulse width, and could be varied to evaluate device yield fallout. Further, narrowing the write pulse width allows a write and write cycle time to be performed at a higher rate of speed.

SUMMARY OF THE INVENTION

It is object of the invention to externally control the width of the write pulse of a synchronous IC memory device.

It is another object of the invention to externally control the width of the write pulse of a synchronous IC memory device in order to determine the narrowest write pulse width at which a write may be successfully performed. Determination of the narrowest write pulse width at which a write may be successfully performed will provide insight on the write margin available to the memory device in performing a write cycle, the identity of marginal cells at an aggressively narrow write pulse width, and device yield fallout.

It is yet another object of the invention to externally control the width of the write pulse of a synchronous IC memory device in order to speed up the write cycle time of the memory device.

Therefore, in accordance with the present invention, a method and control circuit structure for externally controlling the width of a write pulse of a synchronous integrated circuit memory device is disclosed. According to the method of the present invention, first a test mode in which the width of the write pulse of the synchronous integrated circuit memory device may be externally controlled is entered. After entering the test mode, the start of a write pulse of the synchronous integrated circuit memory device is triggered by a transition of a clock signal from a first logic state to a second logic state. Then, the write pulse of the synchronous integrated circuit memory device is selectively terminated by selective manipulation of an external control signal.

According to the structure of the present invention, control circuitry of the synchronous integrated circuit memory device provides for external control of the width of a write pulse of the synchronous integrated circuit memory device. The control circuitry has several functional elements that allow for implementation of external control of the write pulse width, including a first logic element, a second logic element, a third logic element, and a multiplexer. The first logic element, such as a NAND gate or other logic function, generates a speed grade signal given a write test signal and a first signal of a write bus as input signals. The second logic element receives the write test signal and a second signal of the write bus input signals and generates an output signal. The multiplexer receives a third signal of the write bus and a clock signal as input signals. The multiplexer generates an output signal when operational, as determined by the output signal of the second logic element. A third logic element has the output signal of the multiplexer and an external control signal as input signals and generates a control output signal. The control output signal, determined by the state of the external control signal, is an input signal to each block reset control circuit of the synchronous integrated circuit memory device. During a test mode of the synchronous integrated circuit memory device, a transition of the clock signal triggers the start of a write pulse and the control output signal, rather than write bus true and complement signals, determine the end of the write pulse. The external control signal, therefore, is controlled to selectively determine the width of the write pulse.

BRIEF DESCRIPTION OF THE DRAWINGS

The novel features believed characteristic of the invention are set forth in the claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

The present invention provides a method and structure for externally controlling the width of the write pulse control circuitry 10 for accomplishing external and selective control of the width of the write pulse that performs a write to a memory cell of synchronous IC memory device.

Figure 1:
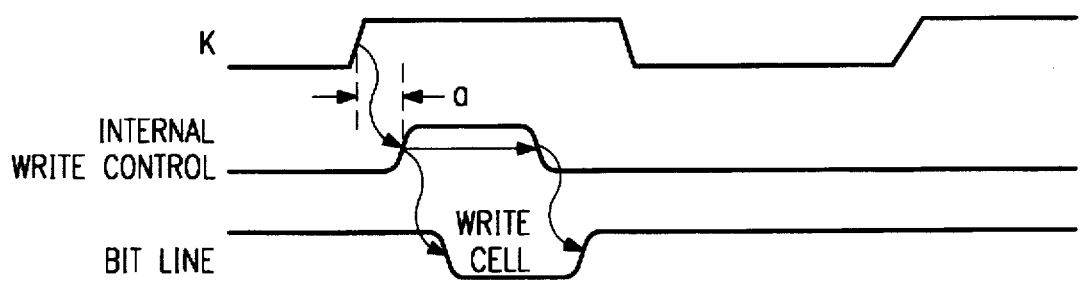
FIG. 1 is a timing diagram of the conventional manner of internally controlling the writing of a memory cell of a synchronous IC memory device, according to the prior art.
Figure 2:
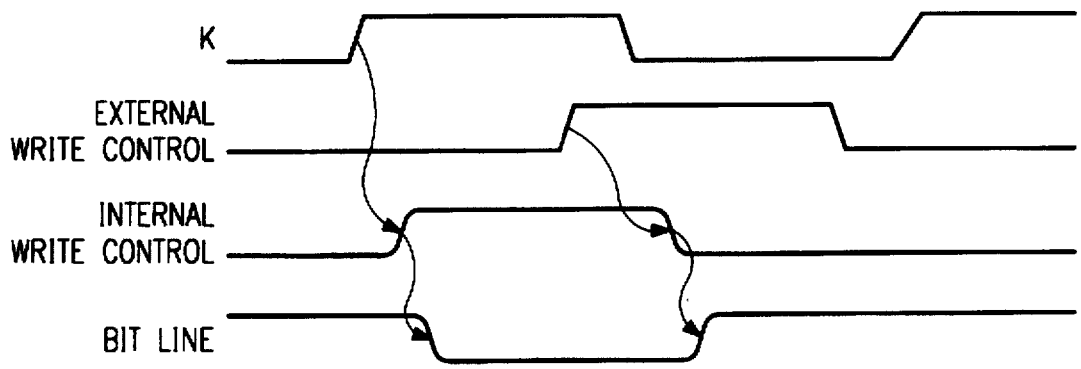
FIG. 2 is a timing diagram of external control of the writing of a memory cell of a synchronous IC memory device, according to the present invention.

External and selective control of the width of the write pulse of an synchronous IC memory device is provided by the present invention. Unlike the prior art in which the width of the write pulse is internally controlled as shown in FIG. 1, the width of the write pulse according to the present invention may be externally controlled. A synchronous IC memory device having the present invention is first placed into a test mode in which the width of the write pulse may be externally controlled. Entry of the device into this test mode may be accomplished by proper manipulation of test mode pins of the device. Referring to FIG. 2, when in the test mode the clock signal K transitioning from a low to a high logic state triggers the start of a write cycle of the device. The end of the write cycle is controlled by an External Write Control signal which may be any suitable signal external to the device such as a Byte Write signal. Transition of the External Write Control signal from a low to a high logic state causes the Internal Write Control signal to transition from a high to a low logic state thereby ending the write pulse. The end of the write pulse in turn forces one or more Bitlines to a high logic state in order to end the writing of the device. The test mode places the device in a long cycle operating mode in which the device will not time-out based upon clock signal K but rather will time-out based upon the External Write Control signal going to a high logic state. Time-out ends the write cycle and allows precharging to take place to prepare for the next cycle.

The use of an External Write Control signal to selectively determine the width of the write pulse of a synchronous IC memory device can be readily seen in FIG. 2. By simply modifying when the External Write Control signal transitions from a low to a high (active) logic state, the write pulse width may be easily lengthened or shortened as desired. This selective and external control of the write pulse width is quite different from the prior art approach of FIG. 1 in which the write pulse width is a predetermined length of time determined by the Internal Write Control signal and can not be varied externally.

Figure 3:
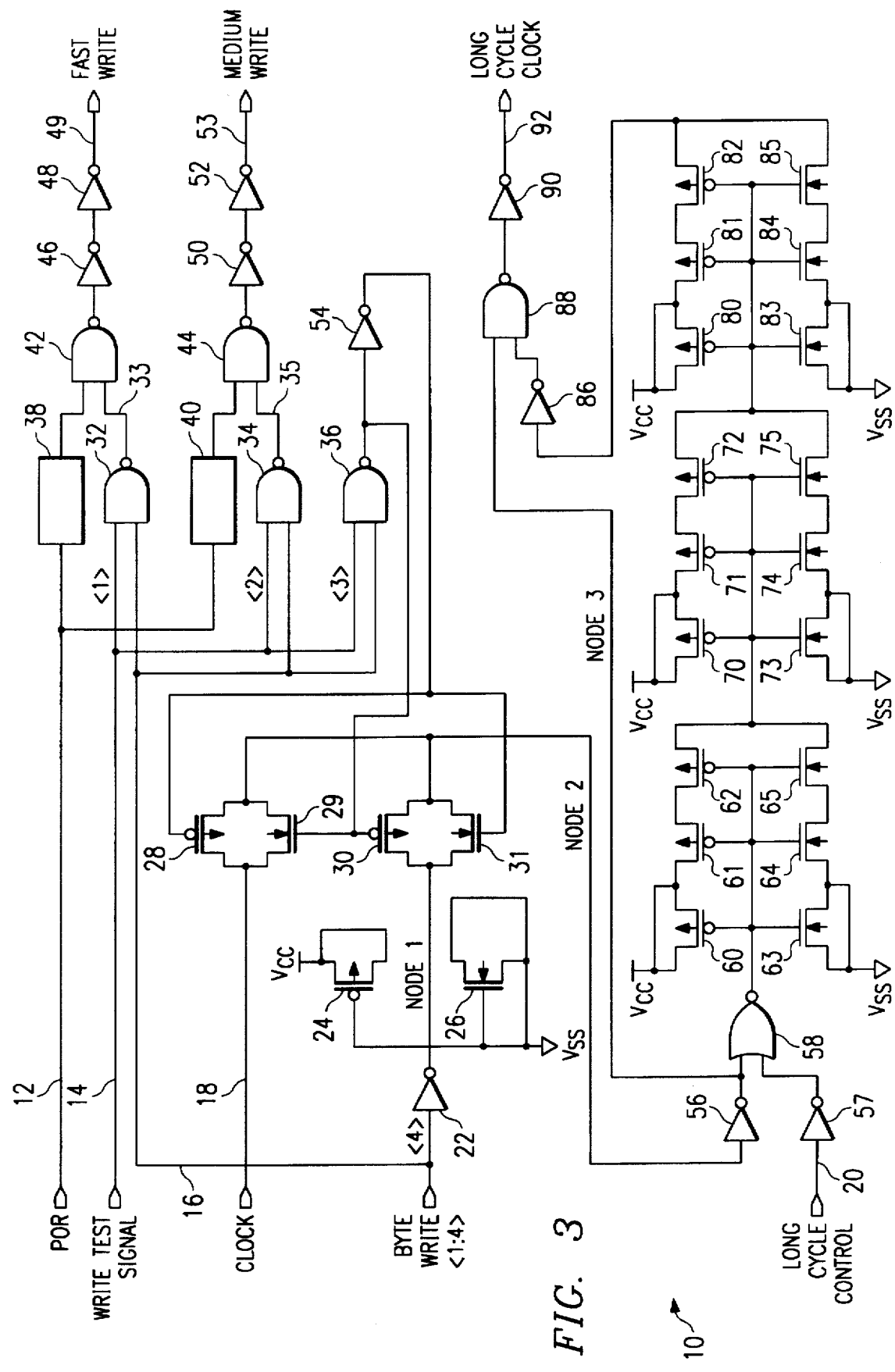
FIG. 3 is control circuitry for accomplishing external and selective control of the width of a write pulse, according to the present invention.

Referring to FIG. 3, the control circuitry 10 for accomplishing external and selective control of the width of the write pulse is shown. Control circuitry 10 comprises inverters 22, 46, 48, 50, 52, 54, 56, 57, 86, and 90; transistors 24, 26, 28, 29, 30, 31, 60, 61, 62, 63, 64, 65, 70, 71, 72, 73, 74, 75, 80, 81, 82, 83, 84, and 85; and logic gates 32, 34, 36, 42, 44, 58, and 88. Control circuitry 10 is presented with the following signals: Power On Reset signal 12, Byte Write signal bus 16, Clock signal 18, and Long Cycle control signal 20. Control circuitry 10 generates the following signals: Fast Write signal 49, Medium Write signal 53, and Long Cycle Clock signal 92. Manipulation of Long Cycle control signal 20 selectively determines the width of a write pulse of the synchronous integrated circuit memory device.

The External Write Control signal shown in FIG. 2 is represented by Byte Write signal bus 16, a bus that has four signals <1>, <2>, <3>, and <4> from the byte write input buffer of the device. While the signals of Block Write signal bus 16 are used in this example to terminate the write cycle, any other pin or a test pin of the device could also be used. Further, it should be noted that thin signals of Byte Write signal bus 16 are not required to be bus signals and can be any signals. If Write Test signal 14 is a logic high state implying the device is in a test mode and signal <3> of Byte Write signal bus 16 is a high logic state, then the output signal of logic element 36 turns on the multiplexer comprised of transistors 24, 26, 28, 30, and 31. Signal <4> of Byte Write signal bus 16 after being inverted by inverter 22 to produce the inverted signal at node Node1 is passed through the multiplexer comprised of transistors 24, 26, 28, 29, 30, and 31 to generate the signal at node Node2. The signal at node Node2 is then inverted by inverter 56 to generate the signal at node Node3. Also during the test mode, the Long Cycle control signal 20 is a logic high signal. The Long Cycle control signal 20 is gated with the signal at Node3 by logic gates 58 and 88 to produce Long Cycle Clock output signal 92. Transistors 60, 61, 62, 63, 64, 65, 70, 71, 72, 73, 74, 75, 80, ,31, 82, 83, 84, and 85 and inverter 86 reside between logic elements 58 and 88 and have the effect of introducing delay into Long Cycle Clock signal 92; the output signal of logic gate 58 is delayed before being gated with the output signal of the multiplexer. Since Long Cycle control signal 20 is a high logic state, Long Cycle Clock output signal 92 is a high-going pulse generated from the rising edge of signal <4> of Byte Write signal bus 16.

Fuse elements 38 and 40 may be blown if desired to permanently set the pulse at a particular internal pulse width to allow for a faster speed grade of the device. Write Test signal 14 and signal <1> of Byte Write signal bus 16 are gated at logic element 32 to produce signal 33 which is then gated with the signal from fuse element 38 at logic gate 42 to generate Fast Write signal 49. Write Test signal 14 and signal <2> of Byte Write signal bus 16 are gated at logic element 34 to produce signal 35 which is then gated with the signal from fuse element 40 at logic gate 44 to generate Medium Write signal 53. Blowing fuse element 38 generates Fast Write signal 49 which provides for a faster speed grade of the device than does blowing fuse element 40 in order to generate Medium Write signal 53, although blowing either fuse element has the effect of speeding up the writing of the device.

Figure 4:
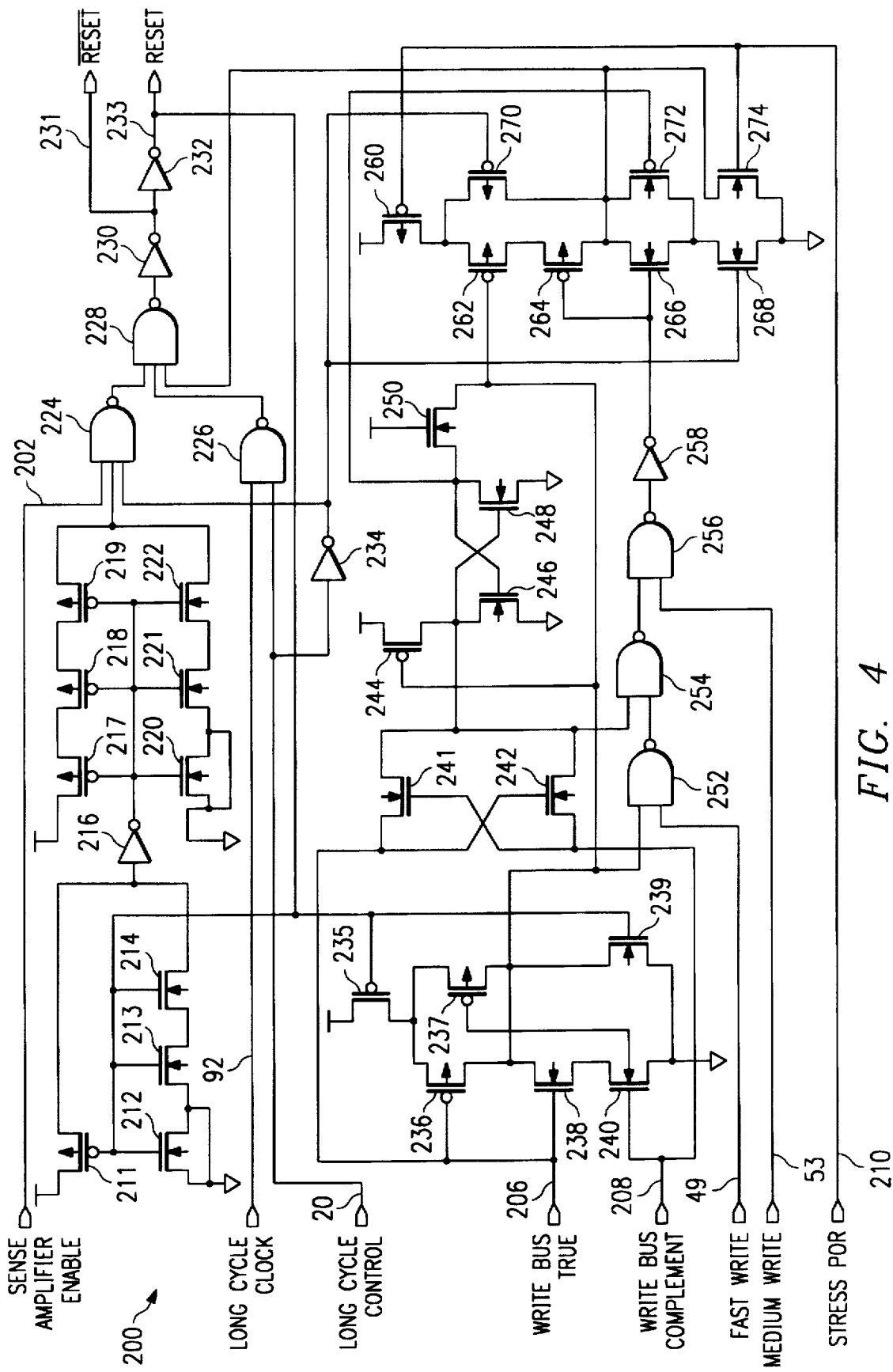
FIG. 4 is a block reset control circuit, according to the present invention.

Further, according to the present invention, each block of the synchronous IC memory device has the block reset control circuit 200 shown in FIG. 4. Block reset control circuit 200 has transistors 211, 212, 213, 214, 217, :218, 219, 220, 221, 222, 235, 236, 237, 238, 239, 240, 241, 242, 244, 246, 248, :250, 252, 254, 256, 258, 260, 262, 264, 266, 268, 270, 272, and 274; inverters 216, 230, 232, 234, 258; and logic elements 224, 226, 228, 252, 254, and 256. Block reset control circuit 200 is supplied with Sense Enable signal 202, Long Cycle Clock signal 92, Long Cycle control signal 20, Write Bus True signal 206, Write Bus Complement signal 208, Fast Write signal 49, Medium Write signal 53, and Stress Power-On Reset signal 210 and generates output signals Reset bar signal 231 and Reset signal 233.

Byte Write signal bus 16 determines the value of Long Cycle Clock 92 which in turn controls when a block of the synchronous IC memory device is reset. When Long Cycle control signal 20 is a high logic level, Long Cycle Clock signal 92 going to a high logic level solely controls Reset signal 2133 which terminates the write cycle. In a normal mode, it is the write busses Write Bus True signal 206 and Write Bus Complement 208 that control Reset bar signal 231 and Reset signal 233. However, during the test mode it is Long Cycle Clock signal 92 and not Sense Amplifier Enable signal 202 nor the write busses Write Bus True signal 206 and Write Bus Complement 208 that controls the logic state of Reset signal 233 and Reset bar signal 231. Reset signal 233 going high turns off the write drivers of the IC memory device and allows equilibration and precharging of bitlines of the device to proceed.

External and selective control of the width of the write pulse of an synchronous IC memory device provides a number of advantages. The present invention provides diagnostic ability to evaluate the shortest pulse width at which a write may still be successfully performed. This diagnostic information on the pulse width pass/fail point can be used in a number of ways. It can be used to determine the amount of write margin a device actually has in a write operation. Additionally, the width of the write pulse may be selectively adjusted to provide a stress screening procedure useful for identifying marginal cells at a particular write pulse width. If the part is shown to write successfully at a given write pulse width, then a fuse could be blown to permanently set the pulse at a particular internal pulse width to allow for a faster speed grade of the device. The width of the write pulse may be reduced or increased to evaluate yield fallout of the device.

An additional advantage of the invention is provided because the length of the write pulse is timed with respect to two signals rather than one signal. It should be noted, however, that the length of the write pulse could be timed with respect to just one signal. Referring again to FIG. 2, according to the present invention, the width of the write pulse width shown as Internal Write Control signal is determined by clock K signal and External Write Control signal; the start of the write cycle is triggered by a high-going clock K signal and the end of the write cycle is triggered by a high-going control signal such as External Write Control signal. Timing the width of the write pulse to two rather than one external signal provides the capability of much tighter and narrower internal write pulses. Typically the device tester will have limitations on how narrow a pulse based upon a particular input signal can be with limitations of about 5 to 10 nS being common. However, no such limitation exists on the edge of a first signal relative to a second signal. Also, triggering the start and end of the write pulse based upon the rising, or falling edges, of two external signals provides more accuracy than may be accomplished by basing the write pulse upon the rising and the falling edge of a single external signal, as slew rate differences and input buffer trip point variations may decrease the accuracy.

While the invention has been particularly shown and described with reference to a preferred embodiment, it will be understood by those skilled in the art that various changes in form and detail may be made therein without departing from the spirit and scope of the invention.

What is claimed is:

1. A method for externally controlling the width of a write pulse of a synchronous integrated circuit memory device, comprising the steps of:
    entering a test mode in which the width of the write pulse of the synchronous integrated circuit memory device may be externally controlled;
    triggering the start of a write pulse of the synchronous integrated circuit memory device by a transition of a clock signal from a first logic state to a second logic state; and
    selectively terminating the write pulse of the synchronous integrated circuit memory device by selective manipulation of an external control signal.

2. The method of claim 1, wherein the step of selectively terminating the write pulse of the synchronous integrated circuit memory device is accomplished by transition of the external control signal from a first logic level to a second logic level.

3. The method of claim 2, wherein the first logic state is equal to the first logic level and the second logic state is equal to the second logic level.

4. The method of claim 2, wherein transition of the external control signal from a first logic level to a second logic level causes the synchronous integrated circuit device to exit a writing state to go to a non-writing state.

5. The method of claim 1, wherein the external control signal is the clock signal or a derivative signal of the clock signal.

6. The method of claim 1, wherein during a normal operating mode, the synchronous integrated circuit memory device is internally self-timed.

7. A method for externally controlling the width of a write pulse of a synchronous integrated circuit memory device, comprising the steps of:
    entering a test mode in which the width of the write pulse of the synchronous integrated circuit memory device may be externally controlled;
    triggering the start of a write pulse of the synchronous integrated circuit memory device by a transition of a clock signal from a first logic state to a second logic state;
    selectively terminating the write pulse of the synchronous integrated circuit memory device by selective manipulation of an external control signal;
    determining an optimal pulse width; and
    blowing a fuse element to set the write pulse to the optimal pulse width.

8. A method for externally controlling the width of a write pulse of a synchronous integrated circuit memory device, comprising the steps of:
    entering a test mode in which the width of the write pulse of the synchronous integrated circuit memory device may be externally controlled;
    triggering the start of a write pulse of the synchronous integrated circuit memory device by a transition of a clock signal from a first logic state to a second logic state; and
    selectively terminating the write pulse of the synchronous integrated circuit memory device by selective manipulation of an external control signal, wherein upon changing the write pulse of the synchronous integrated circuit memory device by selectively terminating the write pulse comprising the additional step of:
        using the write pulse of the synchronous integrated circuit memory device as a screen to identify one or more marginal cells of the synchronous integrated circuit memory device.

9. The method of claim 8, wherein after the step of using the write pulse of the synchronous integrated circuit memory device as a screen to identify one or more marginal cells, comprising the additional step of:
    replacing the one or more marginal cells of the synchronous integrated circuit memory device with one or more redundant elements.

10. The method of claim 8, wherein after the step of using the write pulse of the synchronous integrated circuit memory device as a screen to identify one or more marginal cells, comprising the additional step of:
    discarding the one or more marginal cells of the synchronous integrated circuit memory device.

11. Control circuitry of a synchronous integrated circuit memory device that provides for externally controlling the width of a write pulse of the synchronous integrated circuit memory device, comprising:

a first logic element that receives a write test signal as a first input signal and a first signal as a second input signal and that generates a first speed grade signal;

a second logic element that receives the write test signal as a first input signal and a second signal as a second input signal and that generates an output signal;

a multiplexer that receives a third signal as a first input signal and a clock signal as a second input signal and that generates an output signal when operational, wherein the multiplexer is controlled to be operational by the output signal generated by the second logic element; and a third logic element that receives the output signal of the multiplexer as a first input signal and an external control signal as a second input signal and that generates a control output signal.

wherein during a test mode of the synchronous integrated circuit memory device, a transition of the clock signal from a first logic state to a second logic state triggers the start of a write cycle of the synchronous integrated circuit memory device and the write pulse of the synchronous integrated circuit memory device is selectively terminated by selective manipulation of the external control signal.

12. The control circuit of claim 11, wherein the write pulse of the synchronous integrated circuit memory device is selectively terminated by transition of the external control signal from a first logic level to a second logic level.

13. The control circuit of claim 12, wherein the first logic state is equal to the first logic level and the second logic state is equal to the second logic level.

14. The control circuit of claim 12, wherein transition of the external control signal from a first logic level to a second logic level causes the synchronous integrated circuit device to exit a writing state to go to a non-writing state.

15. The control circuit of claim 11, wherein the control circuitry further comprises:

a fourth logic element that receives the write test signal as a first input signal and a fourth signal as a second input signal and that generates a second speed grade signal.

16. The control circuit of claim 15, wherein the control circuitry further comprises:

a first programmable element having an output signal that is gated with an output signal of the first logic element to produce the first speed grade signal, wherein the first programmable element is capable of being programmed to speed up the first speed grade signal; and a second programmable element having an output signal that is gated with an output signal of the fourth logic element to produce the second speed grade signal, wherein the second programmable element is capable of being programmed to speed up the second speed grade signal.

17. The control circuit of claim 16, wherein the first programmable element is a first fuse and the second programmable element is a second fuse, and the first programmable element is programmed by blowing the first fuse and the second programmable element is programmed by blowing the second fuse.

18. The control circuit of claim 17, wherein the first programmable element and the second programmable element are programmed by a power-on reset signal.

19. The control circuit of claim 15, wherein the control circuitry further comprises:

a first programmable element having an output signal that is gated with an output signal of the second logic element to produce the second speed grade signal, wherein the first programmable element is capable of being programmed to speed up the second speed grade signal.

20. The control circuit of claim 19, wherein the first programmable element is a fuse and the first programmable element is programmed by blowing the fuse.

21. The control circuit of claim 20, wherein the first programmable element is programmed by a power-on reset signal.

22. The control circuit of claim 11, wherein the control circuitry further comprises:

a first programmable element having an output signal that is gated with an output signal of the first logic element to produce the first speed grade signal, wherein the first programmable element is capable of being programmed to speed up the first speed grade signal.

23. The control circuit of claim 22, wherein the first programmable element is a fuse and the first programmable element is programmed by blowing the fuse.

24. The control circuit of claim 23, wherein the first programmable element is programmed by blowing the fuse.

25. The control circuit of claim 11, wherein the control circuitry further comprises:

a delay element that delays an output signal of the third logic element to generate a delayed signal; and a fourth logic element that receives the output signal of the third logic element as a first input signal and the delayed signal generated by the delay element as a second input signal and that generates the control output signal.

26. The control circuit of claim 11, wherein the control circuitry further comprises:

a plurality of block reset control circuits, with each block reset control circuit of the plurality of block reset control circuits associated with a block of a plurality of blocks of the synchronous integrated circuit memory device, wherein each block reset control circuit receives the control output signal as a first input signal and a second signal as a second input signal, and wherein a selected block reset control circuit generates a reset signal that terminates the write pulse of the selected block reset control circuit; and wherein during the test mode of the synchronous integrated circuit memory device, the control output signal controls the reset signal that terminates the write pulse of the selected block reset control signal.

27. The control circuit of claim 26, wherein the block control reset circuit receives the first speed grade signal as a third input signal and the first speed grade signal is capable of speeding up termination of the write pulse of the block reset control signal.

28. The control circuit of claim 26, wherein the block control reset circuit receives a sense amplifier enable signal as a third input signal and during the normal mode of the synchronous integrated circuit memory device, the second signal and the sense amplifier enable signal control the reset signal that terminates the write pulse of the block reset control circuit.

29. The control circuit of claim 26, wherein during a normal mode of the synchronous integrated circuit memory device, the second signal controls the reset signal that terminates the write pulse of the block reset control circuit.

30. The control circuit of claim 11, wherein the external control signal is the clock signal or a derivative signal of the clock signal.

31. The control circuit of claim 11, wherein during a normal operating mode, the synchronous integrated circuit memory device is internally self-timed.

* * * * *